(12) United States Patent
Ho et al.

(10) Patent No.: US 9,559,674 B2
(45) Date of Patent: Jan. 31, 2017

(54) LOW-RIPPLE LATCH CIRCUIT FOR REDUCING SHORT-CIRCUIT CURRENT EFFECT

(71) Applicant: MEDIATEK INC., Hsin-Chu (TW)

(72) Inventors: Chen-Yen Ho, New Taipei (TW); Yu-Hsin Lin, Taipei (TW); Hung-Chieh Tsai, Kaohsiung (TW); Tze-Chien Wang, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/044,114

(22) Filed: Feb. 16, 2016

(65) Prior Publication Data

US 2016/0336927 A1 Nov. 17, 2016

Related U.S. Application Data

(60) Provisional application No. 62/161,601, filed on May 14, 2015.

(51) Int. Cl.
*H03M 1/00* (2006.01)
*H03K 3/356* (2006.01)
(Continued)

(52) U.S. Cl.
CPC ... *H03K 3/356113* (2013.01); *H03K 3/356121* (2013.01); *H03K 3/356191* (2013.01); *H03M 1/0872* (2013.01); *H03M 1/66* (2013.01)

(58) Field of Classification Search
CPC .................. H03K 3/356034; H03K 3/356113; H03K 3/3562; H03K 3/35625; H03K 17/6871; H03K 3/356104; H03K 3/35613; H03K 5/249; H03K 3/023; H03K 3/287
(Continued)

(56) References Cited

U.S. PATENT DOCUMENTS 5,903,169 A * 5/1999 Kong .................... G11C 11/412
326/121
6,310,501 B1 * 10/2001 Yamashita ....... H03K 3/356139
327/211
(Continued)

FOREIGN PATENT DOCUMENTS

EP 2 568 603 A2 3/2013
JP 2010141646 A 6/2010

OTHER PUBLICATIONS

Lin, "A 12 bit 2.9 GS/s DAC With IM3 <- 60 dBc Beyond 1 GHz in 65 nm CMOS", IEEE Journal of Solid-State Circuits, vol. 44, No. 12, Dec. 2009.
(Continued)

*Primary Examiner* — Linh Nguyen
(74) *Attorney, Agent, or Firm* — Winston Hsu; Scott Margo

(57) ABSTRACT

A latch circuit includes an input stage, an amplifying stage and a clock gating circuit. The input stage is arranged for receiving at least a clock signal and a data control signal. The amplifying stage is coupled to the input stage and supplied by a supply voltage and a ground voltage, and is arranged for retaining a data value and outputting the data value according to the clock signal and the data control signal. The clock gating circuit is coupled to the amplifying stage, and is arranged for avoiding a short-circuit current between the supply voltage and the ground voltage.

23 Claims, 6 Drawing Sheets

(51) Int. Cl.
*H03M 1/08* (2006.01)
*H03M 1/66* (2006.01)

(58) Field of Classification Search
USPC . 327/199–204, 210–215, 218, 219; 341/136, 341/143, 144
See application file for complete search history.

(56) References Cited

U.S. PATENT DOCUMENTS

| | | | | |
|---|---|---|---|---|
| 6,441,649 | B1 * | 8/2002 | Martin | H03K 3/356191 327/52 |
| 6,472,920 | B1 * | 10/2002 | Cho | G11C 7/065 327/211 |
| 6,556,060 | B1 * | 4/2003 | Dillon | H03K 3/012 327/210 |
| 6,580,411 | B1 * | 6/2003 | Kubota | G09G 3/3677 345/100 |
| 7,023,255 | B1 * | 4/2006 | Mercer | H03K 3/356156 327/199 |
| 7,193,447 | B1 * | 3/2007 | Liu | G11C 7/065 327/55 |
| 7,760,117 | B1 * | 7/2010 | Chou | H03K 3/356121 327/51 |
| 9,035,680 | B2 * | 5/2015 | Yang | H03K 5/2481 327/215 |
| 2004/0227653 | A1 * | 11/2004 | Bult | H03M 1/0624 341/136 |
| 2005/0040856 | A1 * | 2/2005 | Ramaraju | H03K 3/356121 326/93 |

OTHER PUBLICATIONS

Ho, "A 4.5mW CT Self-Coupled Delta-Sigma Modulator with 2.2MHz BW and 90.4dB SNDR Using Residual ELD Compensation", Digest of Technical Papers, pp. 274-275 and pp. including Figure 15.2.7, Feb. 2015.

A. Van Den Bosch et al, A 12 bit 200 MHz Low Glitch CMOS D/A Converter, Custom Integrated Circuits Conference, 1998, pp. 249-252, XP010293901, IEEE.

* cited by examiner

LOW-RIPPLE LATCH CIRCUIT FOR REDUCING SHORT-CIRCUIT CURRENT EFFECT

CROSS REFERENCE TO RELATED APPLICATIONS

This application claims the priority of U.S. Provisional Application No. 62/161,601, filed on May 14, 2015, which is included herein by reference in its entirety.

BACKGROUND

In a conventional digital-to-analog converter (DAC) latch circuit, a short-circuit current between a supply voltage and a ground voltage is transiently generated while the latch circuit outputs another data value (e.g. output data value from "0" to "1") to the DAC. However, this short-circuit current may induce a data-dependent ripple to a power line, and this data-dependent ripple on the supply voltage may have a significant impact on the sensitive circuits such as switches within the DAC, which may be reflected as a signal-to-noise ratio (SNR) reduction and total harmonic distortion (THD) reduction of the desired signal band.

SUMMARY

It is therefore an objective of the present inventions to provide a latch circuit, which may reduce the short-circuit current effect within the latch circuit, to solve the above-mentioned problems.

According to one embodiment of the present invention, a latch circuit comprises an input stage, an amplifying stage and a clock gating circuit. The input stage is arranged for receiving at least a clock signal and a data control signal. The amplifying stage is coupled to the input stage and supplied by a supply voltage and a ground voltage, and is arranged for retaining a data value and outputting the data value according to the clock signal and the data control signal. The clock gating circuit is coupled to the amplifying stage, and is arranged for disconnecting a path between the supply voltage and the ground voltage while the clock signal has a state transition to avoid a short-circuit current between the supply voltage and the ground voltage.

According to one embodiment of the present invention, a latch circuit comprises an input stage, an amplifying stage and a crossing point control circuit. The input stage is arranged for receiving at least a clock signal and a data control signal. The amplifying stage is coupled to the input stage and supplied by a supply voltage and a ground voltage, and is arranged for retaining and outputting a data value and a corresponding inverted data value according to the clock signal and the data control signal. The crossing point control circuit is coupled to the input stage and the amplifying stage, and is arranged for controlling a crossing point of the data value and the corresponding inverted data value to be not at a middle voltage while the data value changes.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
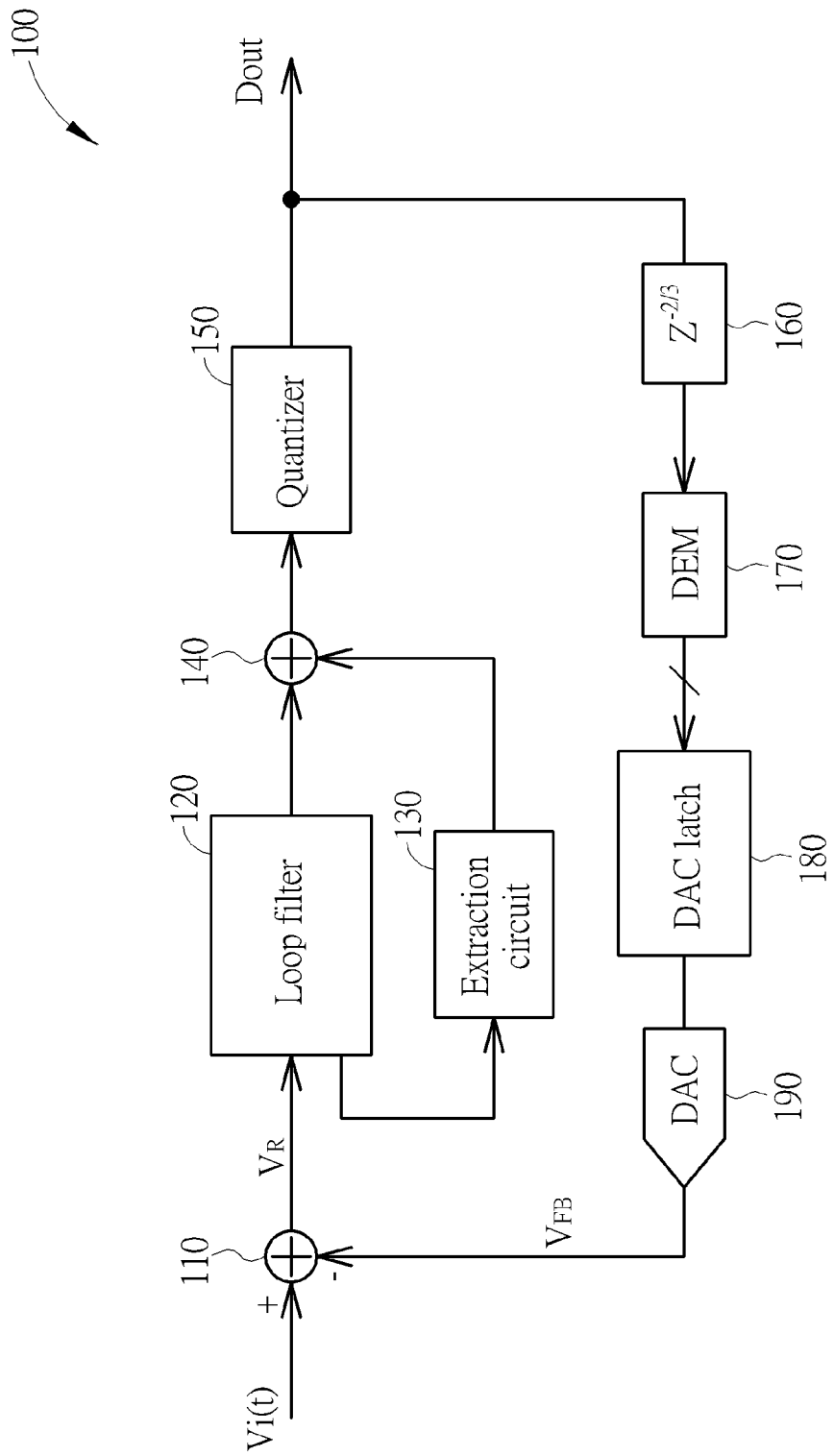
FIG. 1 is a diagram illustrating an ADC according to one embodiment of the present invention.

Please refer to FIG. 1, which is a diagram illustrating an analog-to-digital converter (ADC) 100 according to one embodiment of the present invention, where in this embodiment, the ADC 100 is a continuous-time delta-sigma modulator type ADC. As shown in FIG. 1, the ADC 100 comprises a first summing circuit 110, a loop filter 120, an extraction circuit 130, a second summing circuit 140, a quantizer 150, a phase delay/adjusting circuit 160, a Dynamic Element Matching (DEM) circuit 170, a DAC latch 180 and a DAC 190. In this embodiment, the loop filter 120 comprises a plurality of amplifying stages connected in series, and each amplifying stage may be implemented by an integrator.

In the operations of the ADC 100, the first summing circuit 110 receives an input signal Vi(t) and a feedback signal $V_{FB}$, and calculates a difference by subtracting the feedback signal $V_{FB}$ by the input signal Vi(t) to generate a residual signal $V_R$. Then, the loop filter 120 filters the residual signal $V_R$; meanwhile, the extraction circuit 130 extracts a current from one of the amplifying stages and forwards the extracted current to a following one of the amplifying stages, where in this embodiment the extracted current is forwarded to an output node of the last amplifying stage. The second summing circuit 140 combines the extracted current and an output current of the loop filter 120 to generate a filtered residual signal. The quantizer 150 generates a digital output Dout according to the filtered residual signal. Then, the digital output Dout is processed by the phase delay/adjusting circuit 160, the DEM circuit 170 and the DAC latch 180, and the DAC 190 performs a digital-to-analog converting operation upon the signals outputted from the DAC latch 180 to generate the feedback signal $V_{FB}$ to the first summing circuit 110.

One of the features of the present disclosure is designing the DAC latch 180 to reduce short-circuit current effect to improve the linearity of the DAC 190. Therefore, further descriptions of the other elements are omitted here.

Figure 2:
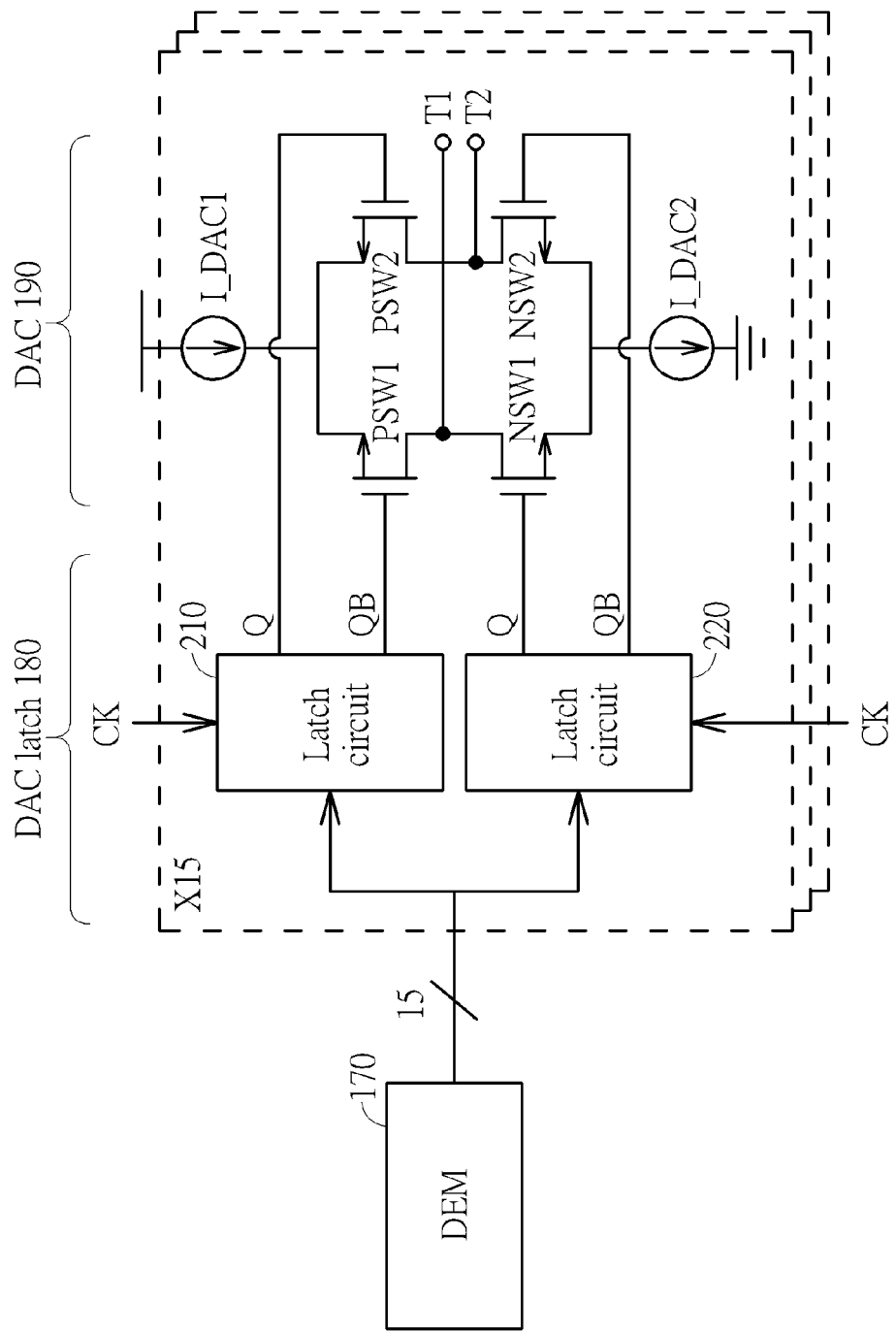
FIG. 2 is a diagram illustrating latch circuits within the DAC latch and current DAC units of the according to one embodiment of the present invention.

Please refer to FIG. 2, which is a diagram illustrating latch circuits within the DAC latch 180 and current DAC units of the DAC 190 according to one embodiment of the present invention. As shown in FIG. 2, the DEM circuit 170 generates fifteen data control signals, and each data control signal is input to two latch circuits 210 and 220 within the DAC latch 180. Then, the latch circuit 210 outputs a data value Q and its inverted data value QB to the P-type switches PSW1 and PSW2 of the DAC 190 according to the received data control signal and a clock signal CK, and the latch circuit 220 outputs a data value Q and its inverted data value QB to the N-type switches NSW1 and NSW2 of the DAC 190 according to the received data control signal and the clock signal CK, to output signals to terminals T1 and T2, where the signals outputted to the terminals T1 and T2 form a portion of the feedback signal $V_{FB}$.

Figure 3:
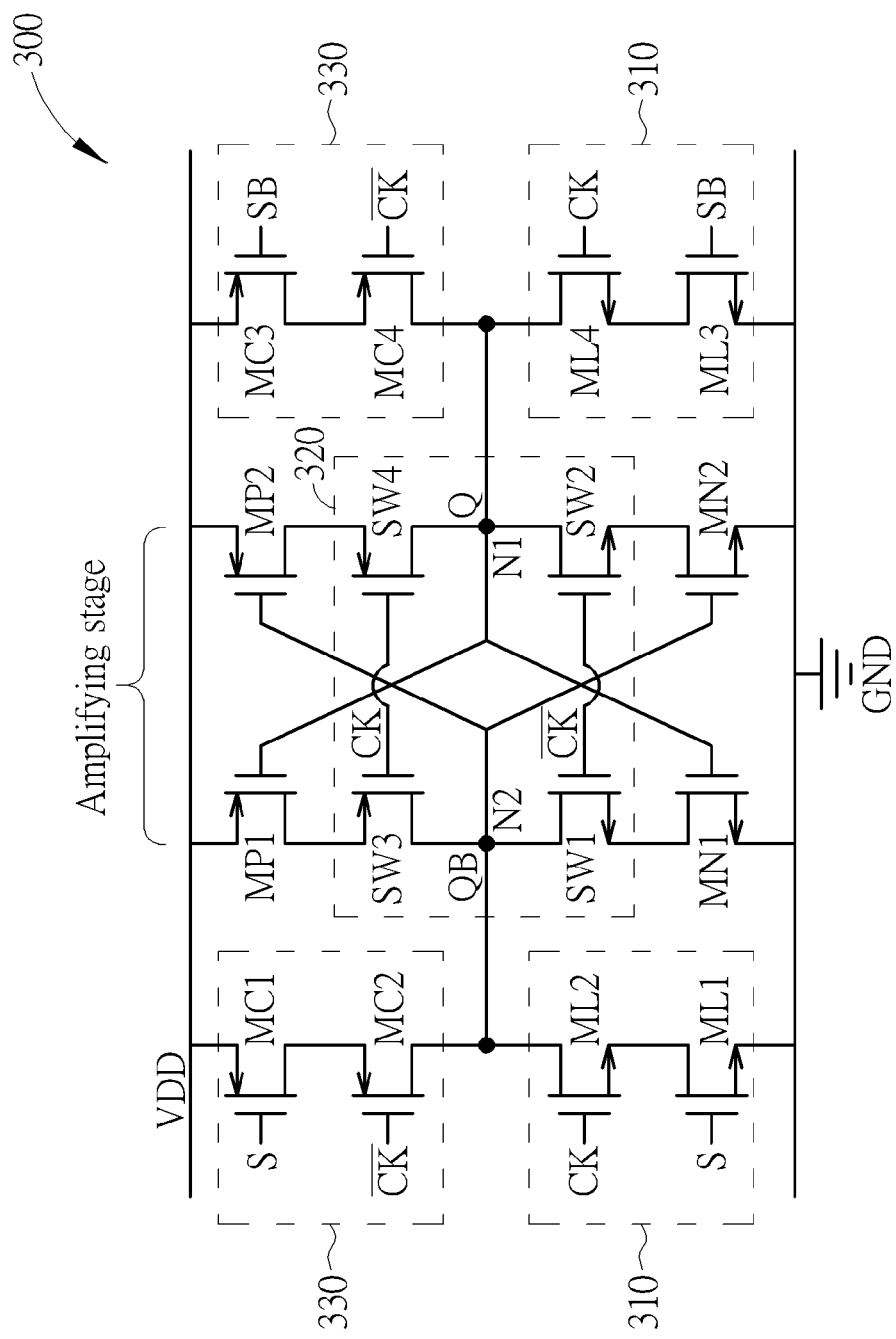
FIG. 3 shows a detailed structure of the latch circuit according to one embodiment of the present invention.

FIG. 3 shows a detailed structure of the latch circuit 300 according to one embodiment of the present invention, where the latch circuit 300 can be the latch circuit 210 or 220 shown in FIG. 2. As shown in FIG. 3, the latch circuit 300 comprises an input stage 310, an amplifying stage, a clock gating circuit 320 and a crossing point control circuit 330. The input stage 310 comprises a first input NMOS ML1 and a second input NMOS ML2 connected in cascode and coupled between a second output terminal N2 and a ground voltage GND, wherein the first input NMOS ML1 and the second input NMOS ML2 are controlled by the data control signal S and the clock signal CK, respectively; and the input stage 310 further comprises a third input NMOS ML3 and a fourth input NMOS ML4 connected in cascode and coupled between a first output terminal N1 and the ground voltage GND, wherein the third input NMOS ML3 and the fourth input NMOS ML4 are controlled by an inverted data control signal SB and the clock signal CK, respectively. Furthermore, the amplifying stage comprises a first NMOS MN1, a second NMOS MN2, a first PMOS MP1, a second PMOS MP2 and a differential output terminals comprising the first output terminal N1 and the second output terminal N2, wherein source electrodes of the first NMOS MN1 and the second NMOS MN2 are coupled to the ground voltage GND, source electrodes of the first PMOS MP1 and the second PMOS MP2 are coupled to the supply voltage VDD, and the first output terminal N1 is coupled to gate electrodes of the first NMOS MN1 and the first PMOS MP1, and the second output terminal N2 is coupled to gate electrodes of the second NMOS MN2 and the second PMOS MP2. The clock gating circuit 320 comprises four switches SW1-SW4 positioned between the first NMOS MN1, the second NMOS MN2, the first PMOS MP1 and the second PMOS MP2 of the amplifying stage. The crossing point control circuit 330 comprises a first control PMOS MC1 and a second control PMOS MC2 connected in cascode and coupled between the second output terminal N2 and the supply voltage VDD, wherein the first control PMOS MC1 and the second control PMOS MC2 are controlled by the data control signal S and an inverted clock signal $\overline{CK}$, respectively; and the crossing point control circuit 330 further comprises a third control PMOS MC3 and a fourth control PMOS MC4 connected in cascode and coupled between the first output terminal N1 and the supply voltage VDD, wherein the third control PMOS MC3 and the fourth control PMOS MC4 are controlled by the inverted control signal SB and the inverted clock signal $\overline{CK}$, respectively.

In the operations of the latch circuit 300, the input stage 310 and the amplifying stage are arranged to perform the conventional latch functions, that is retaining and outputting the data value Q and the corresponding inverted data value QB according to the clock signal CK and the data control signal S; the clock gating circuit 320 is arranged to disconnect a path between the supply voltage VDD and the ground voltage GND while the clock signal CK has a state transition to avoid a short-circuit current between the supply voltage VDD and the ground voltage GND, especially to avoid the short-circuit current flowing through the supply voltage VDD, the amplifying stage, the input stage 310 and the ground voltage GND while the clock signal CK has the state transition; and the crossing point control circuit 330 is arranged to control the data value Q and the corresponding inverted data value QB to not cross at a middle voltage while the data value Q changes (the corresponding inverted data value QB also changes), to stabilize the following DAC 190.

For the operations of the latch circuit 300, the latch circuit 300 is used to receive the data control signal S and its inverted data control signal SB first, and outputs the corresponding data value to the DAC 190 while a clock signal CK changes from a low voltage to a high voltage. For example, when the clock signal CK is at the low voltage, the data control signal S="1" and inverted data control signal SB="0" may input to the latch circuit 300; then when the clock signal CK is rising, the latch circuit 330 starts to output the data value Q="1" and its inverted data value QB="0" from output terminals N1 and N2 to the DAC 190.

Figure 4:
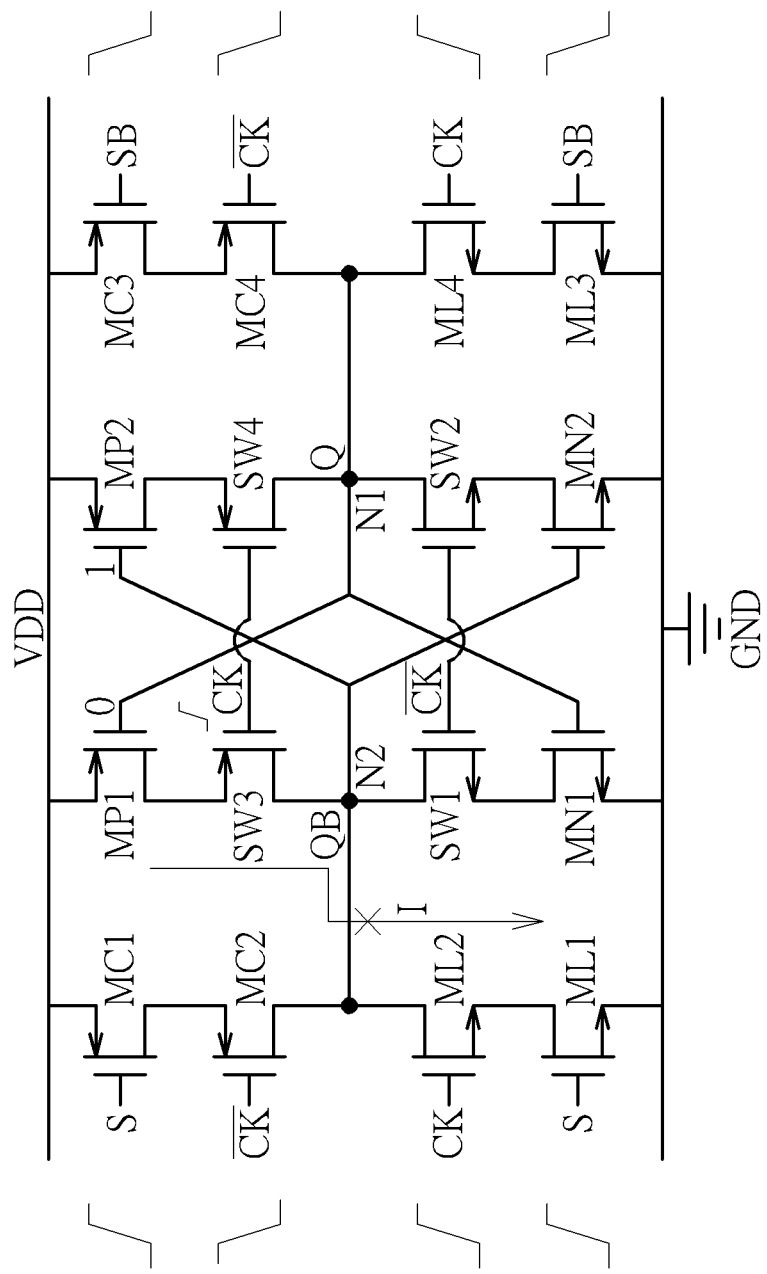
FIG. 4 shows that the latch circuit previously stores the data value Q="0" and the inverted data value QB="1", and the data control signal S is rising from a low voltage to a high voltage according to one embodiment of the present invention.

For the operations of the clock gating circuit 320, referring to FIG. 4, it is assumed that the latch circuit 300 previously stores the data value Q="0" and the inverted data value QB="1", and the data control signal S is rising from a low voltage to a high voltage (i.e. in the next cycle the data value Q="1"). When the clock signal CK is rising from the low voltage to the high voltage, the first input NMOS ML2, the second input NMOS ML2, the third control PMOS MC3 and the fourth control PMOS MC4 are turned on to make Q="1" and QB="0", meanwhile, the clock signal CK controls the switch SW3 to be off to avoid the generation of the short-circuit current I as shown in FIG. 4. In one embodiment, the switch SW3 is turned off before the second input NMOS ML2 turns on. In detail, if the switch SW3 does not exist in the latch circuit 300, when the clock signal CK is rising, the short-circuit current I flowing through the supply voltage VDD, the first PMOS MP1, the first input NMOS ML2 and the second input NMOS ML2 will transiently generate, causing the data-dependent ripple on the supply voltage VDD. Therefore, the design of the clock gating circuit 320 can effectively avoid this data-dependent ripple.

In addition, the other switches SW1, SW2 and SW4 are also to avoid the data-dependent ripple when the latch circuit 300 operates under different condition, for example the switch SW4 can avoid the data-dependent ripple when the latch circuit 300 previously stores Q="1" and QB="0" and the data control signal S changes from the high voltage to the low voltage. Because a person skilled in this art should understand the functions of the switches SW1, SW2 and SW4 after reading the above-mentioned disclosure, further descriptions are omitted here.

For the operations/functions of the crossing point control circuit 330, referring back to the FIG. 2, to stabilize the DAC 190, it is desired that the P-type switches PSW1 and PSW2 are not turned off simultaneously, and the N-type switches NSW1 and NSW2 are not turned off simultaneously. To satisfy these requirements, the driving ability of the first input NMOS ML1 and/or the third input NMOS ML3 is designed to be different from the driving ability of the first control PMOS MC1 and/or the third control PMOS MC3. In one embodiment, the size (i.e. the width) of the third control PMOS MC3 is different from the size of the first input NMOS ML1 to have different driving ability.

Figure 5:
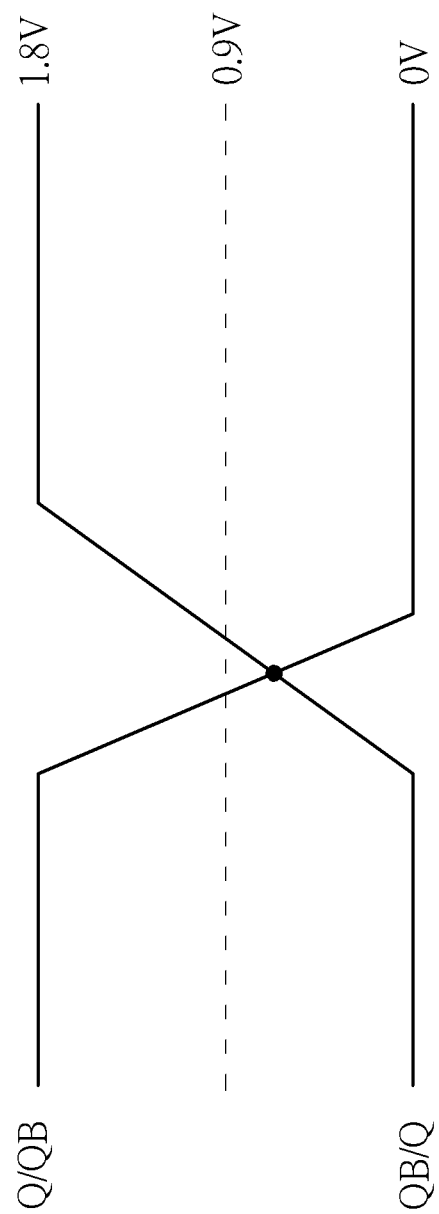
FIG. 5 shows that the crossing point of the data value and the inverted data value is lower than the middle voltage when the data value and the inverted data value are used to drive P-type switches of the DAC.

In detail, when the latch circuit 300 serves as the latch circuit 210 to drive the P-type switches PSW1 and PSW2 of the DAC 190, the sizes of the first input NMOS ML1 and/or the third input NMOS ML3 are designed to be greater than the sizes of the first control PMOS MC1 and/or the third control PMOS MC3, that is the driving ability of ML1/ML3 is greater than that of the MC1/MC3. Therefore, as shown in FIG. 5, the crossing point of the data value Q and the inverted data value QB is lower than the middle voltage (e.g. 0.9V shown in FIG. 5) to make the P-type switches PSW1 and PSW2 of the DAC 190 not be off simultaneously. In addition, when the latch circuit 300 serves as the latch circuit 220 to drive the N-type switches NSW1 and NSW2 of the DAC 190, the sizes of the first input NMOS ML1 and/or the third input NMOS ML3 are designed to be less than the sizes of the first control PMOS MC1 and/or the third control PMOS MC3, that is the driving ability of ML1/ML3 is less than that of the MC1/MC3. Therefore, as shown in FIG. 6, the crossing point of the data value Q and the inverted data value QB is higher than the middle voltage (e.g. 0.9V shown in FIG. 6) to make the N-type switches NSW1 and NSW2 of the DAC 190 not be off simultaneously.

Figure 6:
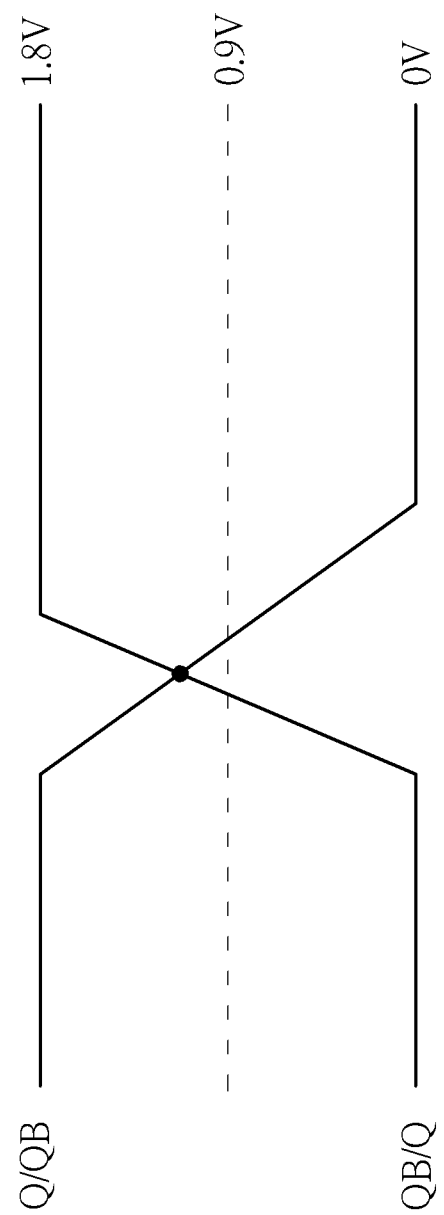
FIG. 6 shows that the crossing point of the data value and the inverted data value is higher than the middle voltage when the data value and the inverted data value are used to drive N-type switches of the DAC.

By using the crossing point control circuit 330 with the embodiments shown in FIG. 5 and FIG. 6, the DAC linearity can be improved, that is the operations of the DAC 190 can be more stable even if the data-dependent ripple occurs.

In the embodiment shown in FIG. 3, the latch circuit 300 comprises the clock gating circuit 320 to reduce the short-circuit current to avoid the data-dependent ripple, and further comprises the crossing point control circuit 330 to stabilize the DAC 190. In other embodiment, however, one of the clock gating circuit 320 and the crossing point control circuit 330 can be removed from the latch circuit 300 without influencing the main operations of the latch circuit 300. This alternative design shall fall within the scope of the present invention.

Briefly summarized, in the latch circuit of the present invention, by using the clock gating circuit and/or the crossing point control circuit, the data-dependent ripple on the supply voltage can be reduced, and the linearity of the following DAC can also be improved to enhance the efficient of the DAC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A latch circuit, comprising:
   an input stage, for receiving at least a clock signal and a data control signal;
   an amplifying stage, coupled to the input stage and supplied by a supply voltage and a ground voltage, for outputting a data value according to the clock signal and the data control signal; and
   a clock gating circuit, coupled to the amplifying stage, for disconnecting a path between the supply voltage and the ground voltage while the clock signal has a state transition;

wherein the amplifying stage comprises:
   a first N-type metal-oxide-semiconductor (NMOS) and a second NMOS, wherein source electrodes of the first NMOS and the second NMOS are coupled to the ground voltage;
   a first P-type metal-oxide-semiconductor (PMOS) and a second PMOS, wherein source electrodes of the first PMOS and the second PMOS are coupled to the supply voltage; and
   a differential output terminals comprising a first output terminal and a second output terminal, wherein the first output terminal is electrically connected to gate electrodes of the first NMOS and the first PMOS, and the second output terminal is electrically connected to gate electrodes of the second NMOS and the second PMOS;
   wherein the clock gating circuit is arranged to selectively connect the first output terminal to drain electrodes of the second NMOS and the second PMOS or not, and to selectively connect the second output terminal to drain electrodes of the first NMOS and the first PMOS or not.

2. The latch circuit of claim 1, wherein the clock gating circuit is arranged for disconnecting the path while the clock signal has the state transition to avoid the short-circuit current flowing through the supply voltage, the amplifying stage, the input stage and the ground voltage.

3. The latch circuit of claim 1, wherein the clock gating circuit comprises a plurality of switches controlled by the clock signal.

4. The latch circuit of claim 1, wherein the clock gating circuit comprises a plurality of switches, wherein at least a portion of the switches are coupled between the first PMOS and the second output terminal and coupled between the second PMOS and the first output terminal, and the portion of the switches are controlled by the clock signal.

5. The latch circuit of claim 4, wherein another portion of the switches are coupled between the first NMOS and the second output terminal and coupled between the second NMOS and the first output terminal, and said another portion of the switches are controlled by an inverted signal of the clock signal.

6. The latch circuit of claim 4, wherein the input stage comprises:
   a first input NMOS and a second input NMOS connected in cascode and coupled between the second output terminal and the ground voltage, wherein the first input NMOS and the second input NMOS are controlled by the data control signal and the clock signal, respectively; and
   a third input NMOS and a fourth input NMOS connected in cascode and coupled between the first output terminal and the ground voltage, wherein the third input NMOS and the fourth input NMOS are controlled by an inverted signal of the data control signal and the clock signal, respectively.

7. The latch circuit of claim 6, wherein when the clock signal changes from a low voltage to a high voltage, the portion of the switches are turned off before the first input NMOS turns on.

8. The latch circuit of claim 1, wherein the amplifying stage is arranged to output the data value and a corresponding inverted data value according to the clock signal and the data control signal, and the latch circuit further comprises:
   a crossing point control circuit, coupled to the input stage and the amplifying stage, for controlling a crossing point of the data value and the corresponding inverted data value to be not at a middle voltage while the data value changes.

9. The latch circuit of claim 8, wherein a size of at least one transistor within the crossing point control circuit is different from a size of at least one transistor within the input stage.

10. The latch circuit of claim 8, wherein the input stage comprises:
   a first input NMOS and a second input NMOS connected in cascode and coupled between the second output terminal and the ground voltage, wherein the first input NMOS and the second input NMOS are controlled by the data control signal and the clock signal, respectively; and
   a third input NMOS and a fourth input NMOS connected in cascode and coupled between the first output terminal and the ground voltage, wherein the third input NMOS and the fourth input NMOS are controlled by an inverted signal of the data control signal and the clock signal, respectively; and
   the crossing point control circuit comprises:
      a first control PMOS and a second control PMOS connected in cascode and coupled between the second output terminal and the supply voltage, wherein the first control PMOS and the second control PMOS are controlled by the data control signal and an inverted signal of the clock signal, respectively; and
      a third control PMOS and a fourth control PMOS connected in cascode and coupled between the first output terminal and the supply voltage, wherein the third control PMOS and the fourth control PMOS are controlled by the inverted signal of the data control signal and the inverted signal of the clock signal, respectively.

11. The latch circuit of claim 10, wherein a size of at least one of the first control PMOS and the third control PMOS is different from a size of at least one of the first input NMOS and the third input NMOS.

12. The latch circuit of claim 8, wherein the latch circuit is applied to a digital to analog converter (DAC); and when the amplifying stage is arranged to output the data value and the corresponding inverted data value to P-type switches of the DAC, the crossing point of the data value and the corresponding inverted data value is lower than the middle voltage while the data value changes; and when the amplifying stage is arranged to output the data value and the corresponding inverted data value to N-type switches of the DAC, the crossing point of the data value and the corresponding inverted data value is higher than the middle voltage while the data value changes.

13. A latch circuit, comprising:
   an input stage, for receiving at least a clock signal and a data control signal;
   an amplifying stage, coupled to the input stage and supplied by a supply voltage and a ground voltage, for outputting a data value and a corresponding inverted data value according to the clock signal and the data control signal; and
   a crossing point control circuit, coupled to the input stage and the amplifying stage, for controlling a crossing point of the data value and the corresponding inverted data value to be not at a middle voltage while the data value changes;
   wherein the input stage comprises:
   a first input NMOS and a second input NMOS connected in cascode and coupled between the second output terminal and the ground voltage, wherein the first input NMOS and the second input NMOS are controlled by the data control signal and the clock signal, respectively; and
   a third input NMOS and a fourth input NMOS connected in cascode and coupled between the first output terminal and the ground voltage, wherein the third input NMOS and the fourth input NMOS are controlled by an inverted signal of the data control signal and the clock signal, respectively; and
   the crossing point control circuit comprises:
      a first control PMOS and a second control PMOS connected in cascode and coupled between the second output terminal and the supply voltage, wherein the first control PMOS and the second control PMOS are controlled by the data control signal and an inverted signal of the clock signal, respectively; and
      a third control PMOS and a fourth control PMOS connected in cascode and coupled between the first output terminal and the supply voltage, wherein the third control PMOS and the fourth control PMOS are controlled by the inverted signal of the data control signal and the inverted signal of the clock signal, respectively.

14. The latch circuit of claim 13, wherein a size of at least one transistor within the crossing point control circuit is different from a size of at least one transistor within the input stage.

15. The latch circuit of claim 13, wherein a size of at least one of the first control PMOS and the third control PMOS is different from a size of at least one of the first input NMOS and the third input NMOS.

16. A latch circuit, comprising:
   an input stage, for receiving at least a clock signal and a data control signal;
   an amplifying stage, coupled to the input stage and supplied by a supply voltage and a ground voltage, for outputting a data value and a corresponding inverted data value according to the clock signal and the data control signal; and
   a crossing point control circuit, coupled to the input stage and the amplifying stage, for controlling a crossing point of the data value and the corresponding inverted data value to be not at a middle voltage while the data value changes;
   wherein the latch circuit is applied to a digital to analog converter (DAC); and when the amplifying stage is arranged to output the data value and the corresponding inverted data value to P-type switches of the DAC, the crossing point of the data value and the corresponding inverted data value is lower than the middle voltage while the data value changes.

17. A latch circuit, comprising:
   an input stage, for receiving at least a clock signal and a data control signal;
   an amplifying stage, coupled to the input stage and supplied by a supply voltage and a ground voltage, for outputting a data value and a corresponding inverted data value according to the clock signal and the data control signal; and
   a crossing point control circuit, coupled to the input stage and the amplifying stage, for controlling a crossing point of the data value and the corresponding inverted data value to be not at a middle voltage while the data value changes;
   wherein the latch circuit is applied to a DAC; and when the amplifying stage is arranged to output the data value and the corresponding inverted data value to N-type switches of the DAC, the crossing point of the data value and the corresponding inverted data value is higher than the middle voltage while the data value changes.

18. A latch circuit, comprising:
an input stage, for receiving at least a clock signal and a data control signal;
an amplifying stage, coupled to the input stage and supplied by a supply voltage and a ground voltage, for outputting a data value according to the clock signal and the data control signal; and
a clock gating circuit, coupled to the amplifying stage, for disconnecting a path between the supply voltage and the ground voltage while the clock signal has a state transition;
wherein the amplifying stage is arranged to output the data value and a corresponding inverted data value according to the clock signal and the data control signal, and the latch circuit further comprises:
  a crossing point control circuit, coupled to the input stage and the amplifying stage, for controlling a crossing point of the data value and the corresponding inverted data value to be not at a middle voltage while the data value changes; and
the input stage comprises:
  a first input NMOS and a second input NMOS connected in cascode and coupled between the second output terminal and the ground voltage, wherein the first input NMOS and the second input NMOS are controlled by the data control signal and the clock signal, respectively; and
  a third input NMOS and a fourth input NMOS connected in cascode and coupled between the first output terminal and the ground voltage, wherein the third input NMOS and the fourth input NMOS are controlled by an inverted signal of the data control signal and the clock signal, respectively; and
the crossing point control circuit comprises:
  a first control PMOS and a second control PMOS connected in cascode and coupled between the second output terminal and the supply voltage, wherein the first control PMOS and the second control PMOS are controlled by the data control signal and an inverted signal of the clock signal, respectively; and
  a third control PMOS and a fourth control PMOS connected in cascode and coupled between the first output terminal and the supply voltage, wherein the third control PMOS and the fourth control PMOS are controlled by the inverted signal of the data control signal and the inverted signal of the clock signal, respectively.

19. The latch circuit of claim 18, wherein the clock gating circuit is arranged for disconnecting the path while the clock signal has the state transition to avoid the short-circuit current flowing through the supply voltage, the amplifying stage, the input stage and the ground voltage.

20. The latch circuit of claim 18, wherein the clock gating circuit comprises a plurality of switches controlled by the clock signal.

21. A latch circuit, comprising:
an input stage, for receiving at least a clock signal and a data control signal;
an amplifying stage, coupled to the input stage and supplied by a supply voltage and a ground voltage, for outputting a data value according to the clock signal and the data control signal; and
a clock gating circuit, coupled to the amplifying stage, for disconnecting a path between the supply voltage and the ground voltage while the clock signal has a state transition;
wherein the amplifying stage is arranged to output the data value and a corresponding inverted data value according to the clock signal and the data control signal, and the latch circuit further comprises:
  a crossing point control circuit, coupled to the input stage and the amplifying stage, for controlling a crossing point of the data value and the corresponding inverted data value to be not at a middle voltage while the data value changes;
wherein the latch circuit is applied to a digital to analog converter (DAC); and when the amplifying stage is arranged to output the data value and the corresponding inverted data value to P-type switches of the DAC, the crossing point of the data value and the corresponding inverted data value is lower than the middle voltage while the data value changes; and when the amplifying stage is arranged to output the data value and the corresponding inverted data value to N-type switches of the DAC, the crossing point of the data value and the corresponding inverted data value is higher than the middle voltage while the data value changes.

22. The latch circuit of claim 21, wherein the clock gating circuit is arranged for disconnecting the path while the clock signal has the state transition to avoid the short-circuit current flowing through the supply voltage, the amplifying stage, the input stage and the ground voltage.

23. The latch circuit of claim 21, wherein the clock gating circuit comprises a plurality of switches controlled by the clock signal.

* * * * *